(12) United States Patent
Wu

(10) Patent No.: US 8,872,570 B2
(45) Date of Patent: Oct. 28, 2014

(54) MULTIPLE POWER DOMAIN CIRCUIT AND RELATED METHOD

(71) Applicant: Taiwan Semiconductor Manufacturing Company, Ltd., Hsin-Chu (TW)

(72) Inventor: Jui-Jen Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/902,324

(22) Filed: May 24, 2013

(65) Prior Publication Data

US 2014/0184300 A1    Jul. 3, 2014

Related U.S. Application Data

(60) Provisional application No. 61/747,141, filed on Dec. 28, 2012.

(51) Int. Cl.
*H03L 5/00* (2006.01)

(52) U.S. Cl.
USPC ............... 327/333; 327/404; 365/230.06

(58) Field of Classification Search
USPC ................. 327/333, 404; 365/230.06
See application file for complete search history.

(56) References Cited

U.S. PATENT DOCUMENTS

| | | | | |
|---|---|---|---|---|
| 5,559,996 A | * | 9/1996 | Fujioka | 703/23 |
| 7,564,288 B2 | * | 7/2009 | Seki et al. | 327/333 |
| 7,729,180 B2 | * | 6/2010 | Hirabayashi | 365/189.11 |
| 7,733,735 B2 | * | 6/2010 | Origasa | 365/230.06 |

OTHER PUBLICATIONS

Kim, Jung Pill et al., "A 45nm 1Mb Embedded STT-MRAM with design techniques to minimize read-disturbance," IEEE 2011 Symposium on VLSI Circuits Digest of Technical Papers, Jun. 15-17, 2001, pp. 296-297.

* cited by examiner

*Primary Examiner* — Kenneth B. Wells
(74) *Attorney, Agent, or Firm* — Slater & Matsil, L.L.P.

(57) ABSTRACT

A multiple power domain circuit includes a trigger circuit, a high threshold voltage circuit electrically connected to an output terminal of the trigger circuit, and a low threshold voltage circuit electrically connected to the output terminal of the trigger circuit and an output terminal of the high threshold voltage circuit. The low threshold voltage circuit comprises a pulse generator electrically connected to the output terminal of the trigger circuit, and an inverter electrically connected to an output terminal of the pulse generator, and the output terminal of the high threshold voltage circuit.

20 Claims, 4 Drawing Sheets

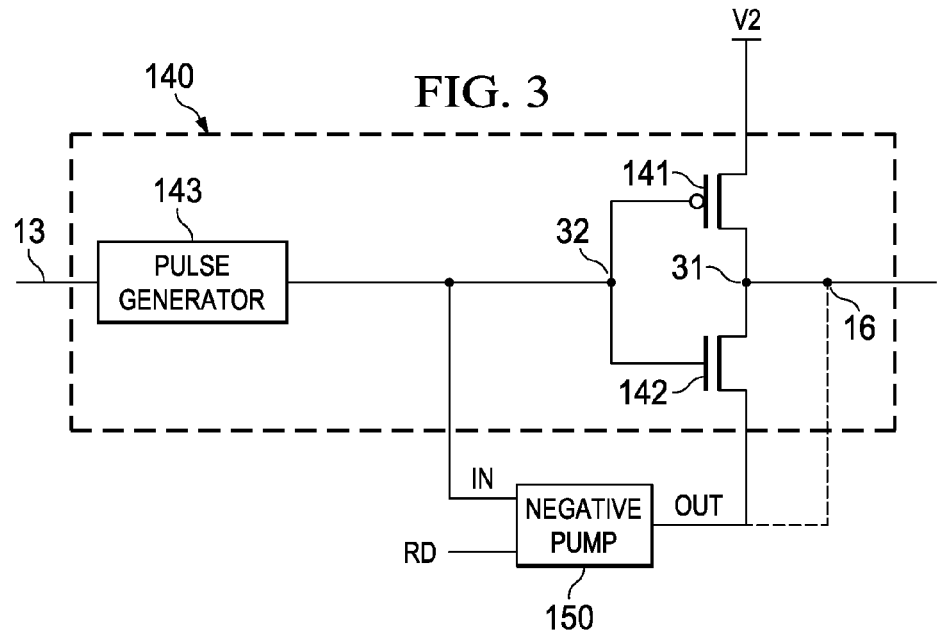
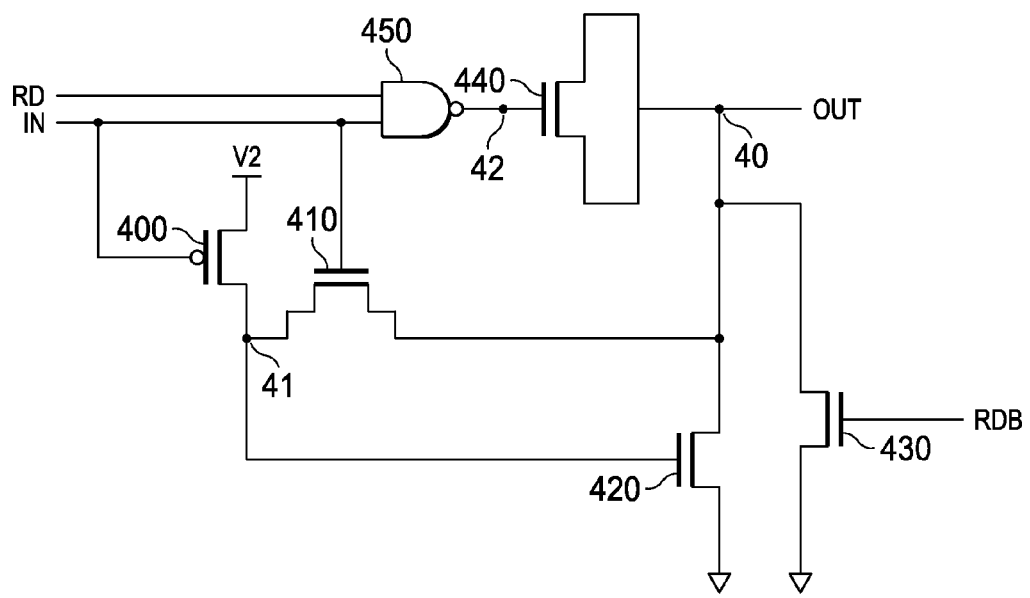

MULTIPLE POWER DOMAIN CIRCUIT AND RELATED METHOD

This application claims priority to U.S. Provisional Application Ser. No. 61/747,141, filed on Dec. 28, 2012, entitled "Multiple Power Domain Circuit and Related Method," which application is hereby incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). As device dimensions shrink, voltage nodes also shrink, with modern core device voltages trending toward less than 1 Volt, and input/output (I/O) device voltages under 2 Volts.

Non-volatile memory (NVM), a type of memory that retains stored data in both powered and unpowered states, is often embedded in complementary metal-oxide-semiconductor (CMOS) logic processes, and typically requires high programming voltage for operation. In many NVM applications, a word line (WL) decoder drives high voltage on a word line for programming, and low voltage on the word line for reading. In one time programmable (OTP) NVM, the high voltage is only available when the NVM is programmed (e.g., at the factory), and the low voltage is available during programming and in the final product.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 3 is a circuit diagram of a bypass path and negative pump of FIG. 1 in accordance with various embodiments of the present disclosure;

FIG. 4 is a detailed circuit diagram of the negative pump of FIG. 3 in accordance with various embodiments of the present disclosure;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a word line driver circuit, and the like. Other embodiments may also be applied, however, to other types of memory circuits.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Non-volatile memory circuits, which include flash, floating gate, magnetic, and resistive types, among others, are designed to store data by assuming a state (e.g., a certain electric charge) that is not affected by loss of power to the non-volatile memory circuit. In many applications, a word line decoder drives high voltage on a word line to program a non-volatile memory cell, and drives a low voltage on the word line to read the non-volatile memory cell. A word line driver that performs the driving employs a high voltage device to tolerate high voltage. However, the high voltage device may degrade read operation performance (e.g., speed) at low voltage due to high threshold voltage (Vth) of the high voltage device.

In the following disclosure, a novel word line driver architecture is introduced that has increased speed in multiple power domain applications. The word line driver uses a bypass path to improve performance (e.g., speed) in read mode while maintaining program performance. The word line driver exhibits short rising time, precise voltage control, and wide power supply range.

Figure 1:
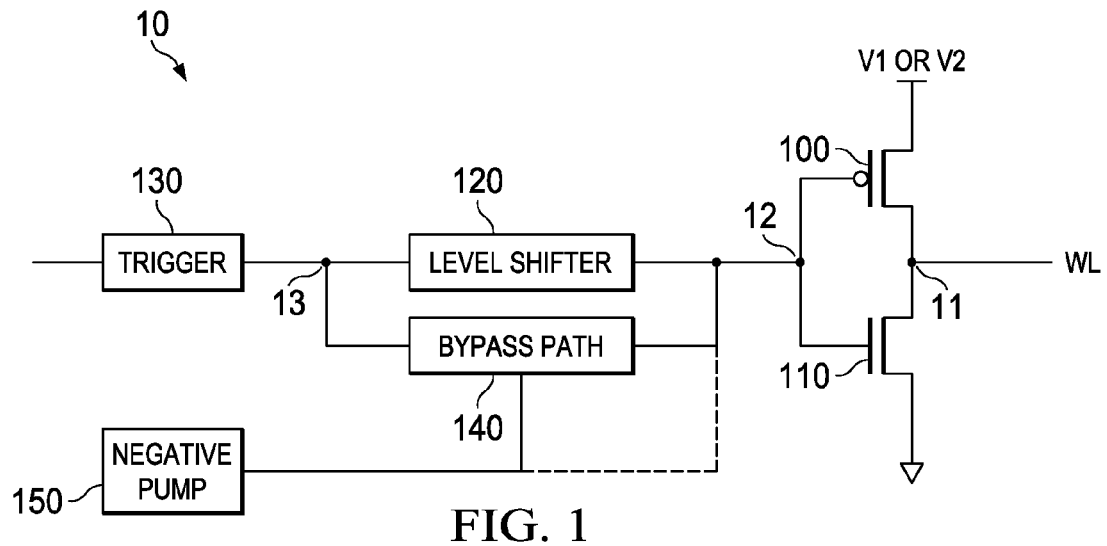
FIG. 1 is a circuit diagram of a word line driver in accordance with various embodiments of the present disclosure.

FIG. 1 is a circuit diagram of a word line driver 10 in accordance with various embodiments of the present disclosure. The word line driver 10 includes transistors 100 and 110, level shifter 120, trigger circuit 130, bypass path 140, and a negative pumping circuit 150 (or "negative pump 150"). Internal connections of the word line driver 10 are made at least at circuit nodes 11, 12, and 13.

The word line driver 10 drives a word line at the node 11. The transistor 100, which is a P-type MOS (PMOS) transistor in some embodiments, is electrically connected to the node 11, and is further electrically connected to a first voltage supply that supplies a first voltage V1 during program operations, and a lower second voltage V2 during read operations. A source electrode of the transistor 100 is electrically connected to the first voltage supply, and a drain electrode of the transistor 100 is electrically connected to the word line (node 11). The transistor 110, which is an N-type MOS (NMOS) transistor in some embodiments, is electrically connected to the node 11 and a low voltage supply (e.g., ground). A source electrode of the transistor 110 is electrically connected to the low voltage supply, and a drain electrode of the transistor 110 is electrically connected to the word line (node 11). A gate electrode of the transistor 100 is electrically connected to a gate electrode of the transistor 110 at the node 12. The transistors 100 and 110 are high threshold voltage ($V_{TH}$) devices (e.g., I/O devices) in some embodiments.

Figure 2:
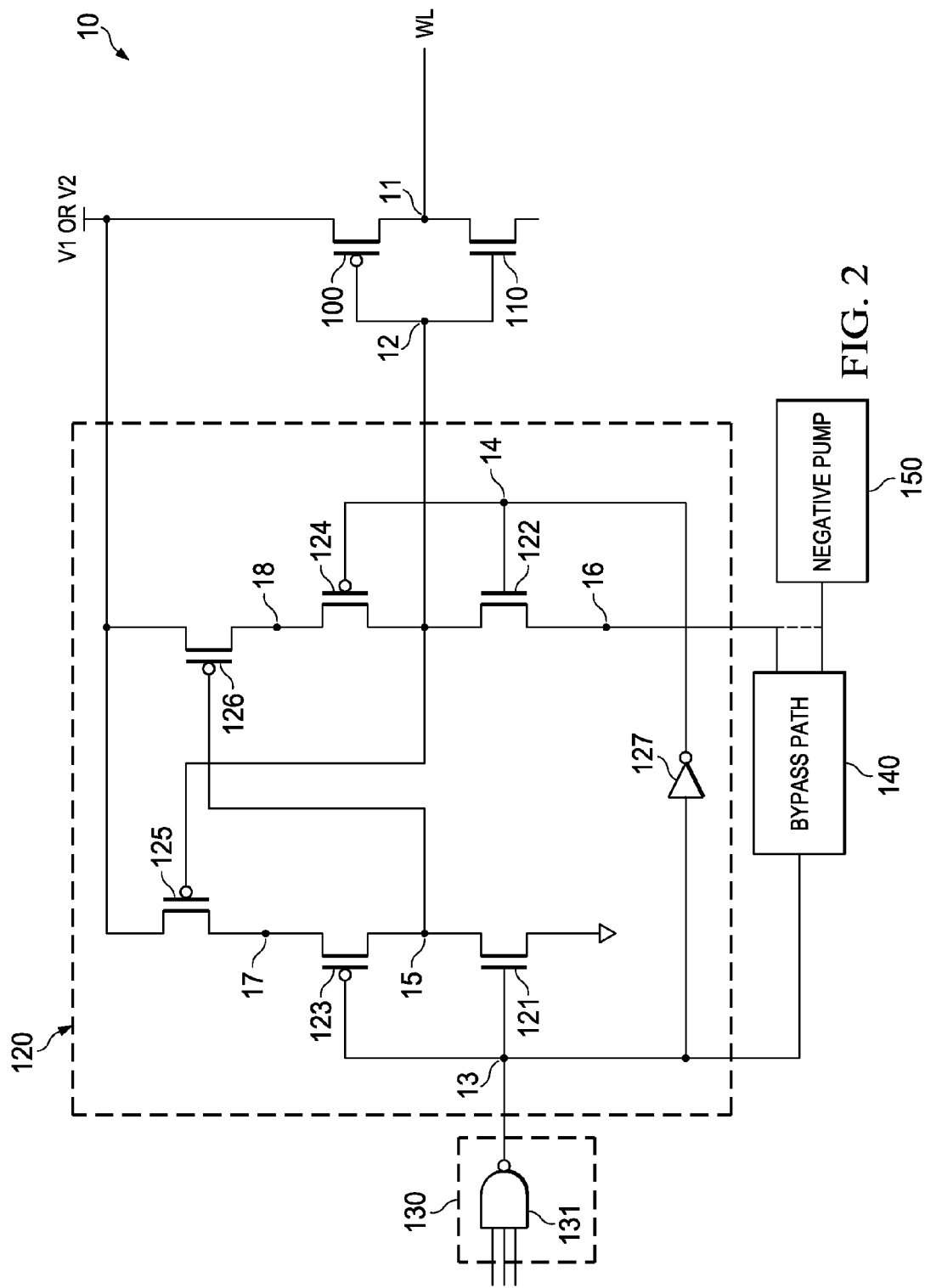
FIG. 2 is a detailed circuit diagram of the word line driver of FIG. 1 in accordance with various embodiments of the present disclosure.

In some embodiments, the level shifter 120 is a high threshold voltage circuit, and has an input terminal electrically connected to the node 13, and an output terminal electrically connected to the node 12. The level shifter 120, which is shown in greater detail in FIG. 2, is configured to convert a logic signal from the trigger circuit 130 from a low operating voltage range (e.g., a core voltage range of about 0 Volts to about 0.9 Volts) to a high operating voltage range (e.g., a program voltage range of about 0 Volts to about 6 Volts). The level shifter 120 is made of high $V_{TH}$ devices in some embodiments.

In some embodiments, the trigger circuit 130 is a decoder, and has at least one input terminal for receiving an address signal, and an output terminal electrically connected to the node 13. In some embodiments, the trigger circuit 130 is made of low $V_{TH}$ devices (e.g., core devices). In some embodiments, the trigger circuit 130 outputs a logic low signal when the address signal selects the word line driver 10 for driving the word line WL.

High $V_{TH}$ devices, such as those used in the level shifter 120 and the transistors 100 and 110, are slower than low $V_{TH}$ devices, but are able to operate over higher voltage ranges while maintaining good reliability. In OTP applications, a memory array electrically connected to the word line driver 10 is programmed once, and can be read multiple times thereafter. Because the memory array is only programmed once, after programming is completed, only the low operating voltage range is needed for read operations. Thus, in a finished product including the memory array, the low operating voltage range is used to operate the high $V_{TH}$ devices. If, during a read operation, an output signal of the decoder can only pass through the level shifter 120 (high $V_{TH}$ devices) to pull down gate voltage at the gate electrodes of the transistors 100 and 110, fighting between the transistors 124, 126 and the transistor 122 occurs. The fighting prolongs setup of a low voltage at the node 12, and is exacerbated by the slow speed of the high $V_{TH}$ devices.

Referring again to FIG. 1, in some embodiments, the bypass path 140 is a low threshold voltage circuit, and is made of at least low $V_{TH}$ devices. The bypass path 140 provides a faster path for the output signal of the decoder to pull down the gate voltage at the gate electrodes of the transistors 100 and 110 by enhancing driving strength of the transistor 122. In conjunction with, or independently from, the bypass path 140, the negative pump 150 enhances pulling down of an internal node of the level shifter 120 to speed up pulling down of the gate voltage even further. In some embodiments, the negative pump 150 is electrically connected to the level shifter 120 through the bypass path 140. In some embodiments, the negative pump 150 is directly electrically connected to the level shifter 120.

FIG. 2 is a detailed circuit diagram of the word line driver 10 of FIG. 1. In some embodiments, the level shifter 120 includes transistors 121, 122, 123, 124, 125, and 126. In some embodiments, the transistors 121 and 121 are NMOS transistors, and the transistors 123, 124, 125, and 126 are PMOS transistors. A gate electrode of the transistor 121 is electrically connected to the output terminal of the trigger circuit 130 (node 13), hereinafter alternately referred to as "the decoder 130." A drain electrode of the transistor 121 is electrically connected to a node 15, and a source electrode of the transistor 121 is electrically connected to the low voltage supply (e.g., ground). When gate-source voltage $V_{GS}$ of the transistor 121 is greater than threshold voltage $V_{TH}$ of the transistor 121, the transistor 121 turns on to pull down voltage at the node 15. When the gate-source voltage $V_{GS}$ of the transistor 121 is less than the threshold voltage $V_{TH}$ of the transistor 121, the transistor 121 turns off to present high impedance looking into the drain electrode of the transistor 121 from the node 15.

A gate electrode of the transistor 123 is electrically connected to the output terminal of the decoder 130 (node 13). A drain electrode of the transistor 123 is electrically connected to the node 15, and a source electrode of the transistor 123 is electrically connected to a node 17. When source-gate voltage $V_{SG}$ of the transistor 123 is greater than threshold voltage $V_{TH}$ of the transistor 123, the transistor 123 turns on to pull up voltage at the node 15 to about voltage at the node 17. When the source-gate voltage $V_{SG}$ of the transistor 123 is less than the threshold voltage $V_{TH}$ of the transistor 123, the transistor 123 turns off to present high impedance looking into the drain electrode of the transistor 123 from the node 15.

An inverter 127 outputs voltage that is the inverse of voltage outputted by the decoder 130 to provide differential input to the level shifter 120. In some embodiments, the inverter is made of low $V_{TH}$ devices (e.g., core devices). An input terminal of the inverter 127 is electrically connected to the output terminal of the decoder 130 (node 13). The transistor 122 is a pull-down transistor for pulling down the voltage at the node 12. A gate electrode of the transistor 122 is electrically connected to the output terminal of the inverter 127 (node 14). A drain electrode of the transistor 122 is electrically connected to the node 12, and a source electrode of the transistor 122 is electrically connected to the output terminal of the bypass path 140 (node 16). When gate-source voltage $V_{GS}$ of the transistor 122 is greater than threshold voltage $V_{TH}$ of the transistor 122, the transistor 122 turns on to pull down voltage at the node 12. When the gate-source voltage $V_{GS}$ of the transistor 122 is less than the threshold voltage $V_{TH}$ of the transistor 122, the transistor 122 turns off to present high impedance looking into the drain electrode of the transistor 122 from the node 12. In some embodiments, the transistor 122 is part of the bypass path 140 (e.g., shared with the level shifter 120).

A gate electrode of the transistor 124 is electrically connected to the output terminal of the inverter 127 (node 14). A drain electrode of the transistor 124 is electrically connected to the node 12, and a source electrode of the transistor 124 is electrically connected to a node 18. When source-gate voltage $V_{SG}$ of the transistor 124 is greater than threshold voltage $V_{TH}$ of the transistor 124, the transistor 124 turns on to pull up voltage at the node 12 to about voltage at the node 18. When the source-gate voltage $V_{SG}$ of the transistor 124 is greater than the threshold voltage $V_{TH}$ of the transistor 124, the transistor 124 turns off to present high impedance looking into the drain electrode of the transistor 124 from the node 12.

A gate electrode of the transistor 125 is electrically connected to the gate electrodes of the transistors 100, 110 (node 12), which is also a non-inverting output of the level shifter 120. A drain electrode of the transistor 125 is electrically connected to the node 17, and a source electrode of the transistor 125 is electrically connected to the first voltage supply. When source-gate voltage $V_{SG}$ of the transistor 125 is greater than threshold voltage $V_{TH}$ of the transistor 125, the transistor 125 turns on to pull up voltage at the node 17 to about voltage of the first voltage supply, which is a high voltage in program operations, and a low voltage in read operations. When the source-gate voltage $V_{SG}$ of the transistor 125 is less than the threshold voltage $V_{TH}$ of the transistor 125, the transistor 125 turns off to present high impedance looking into the drain electrode of the transistor 125 from the node 17.

A gate electrode of the transistor 126 is electrically connected to the node 15, which is also an inverting output of the level shifter 120. A drain electrode of the transistor 126 is electrically connected to the node 18, and a source electrode of the transistor 126 is electrically connected to the first voltage supply. When source-gate voltage $V_{SG}$ of the transistor 126 is greater than threshold voltage $V_{TH}$ of the transistor 126, the transistor 126 turns on to pull up voltage at the node 18 to about voltage of the first voltage supply, which is a high voltage in program operations, and a low voltage in read operations. When the source-gate voltage $V_{SG}$ of the transistor 126 is less than the threshold voltage $V_{TH}$ of the transistor 126, the transistor 126 turns off to present high impedance looking into the drain electrode of the transistor 126 from the node 18.

The decoder 130 includes a logic gate 131. In some embodiments, the logic gate 131 is a NAND gate. In some embodiments, the logic gate 131 has three input terminals for receiving the address signal, and an inverting output terminal for outputting a logic low voltage when all input terminals of the logic gate 131 are logic high, and a high logic voltage when any input terminal of the input terminals is logic low. When the decoder 130 outputs the logic high voltage (e.g., in standby), the transistor 121 is turned on, and the transistor 121 pulls down voltage at the gate electrode of the transistor 126 (node 15) to a low voltage (e.g., ground). The low voltage at the gate electrode of the transistor 126 turns on the transistor 126 ($V_{SG}$>$V_{TH}$), so that the voltage at the node 18 is pulled up to about the voltage at the first voltage supply (e.g., the voltage minus a source-drain voltage $V_{SD}$ of the transistor 126). The gate electrode of the transistor 122 and the gate electrode of the transistor 124 both receive the logic low voltage from the output terminal of the inverter 127. The logic low voltage turns off the transistor 122. The transistor 124 turns on due to the high voltage at the node 18 and the low voltage at the node 14, which pulls up the voltage at the node 12 to about the voltage at the node 18 (e.g., the voltage minus a source-drain voltage $V_{SD}$ of the transistor 124). With the voltage at the node 12 high, the transistor 110 turns on to pull down voltage of the word line WL to voltage of the low voltage supply (e.g., ground).

When the decoder 130 outputs the logic low voltage (e.g., in a read period), the transistor 121 is turned off, and the transistor 123 is turned on. Voltage at the node 14 is quickly pulled up by the inverter 127, which inverts the logic low voltage at the input terminal of the inverter 127 (node 13) to the logic high voltage. The high voltage at the gate electrode of the transistor 122 turns on the transistor 122 to pull down voltage at the node 12, which corresponds to the gate electrode of the transistor 125. The high voltage at the node 14 acts to turn off the transistor 124. The low voltage at the gate electrode of the transistor 125 turns on the transistor 125, making a path for the voltage at the first voltage supply (e.g., the logic high voltage) to pull up the voltage at the node 15 through the transistors 123, 125.

Fighting occurs between the transistors 124, 126 and the transistor 122 due to the slower speed of the transistors 123, 125 pulling up the voltage at the node 15 (to turn off the transistor 126) relative to the higher speed of the inverter 127 pulling up the voltage at the node 14. The high voltage at 14 further rapidly turns off the transistor 124. Stated another way, the voltage at the node 14 may quickly turn on the transistor 122 to start draining charge from the node 12, but the transistor 126 may remain turned on as the slower transistors 123, 125 continue pulling up the voltage at the gate electrode of the transistor 126. Eventually, the high voltage at the node 15, corresponding to the gate electrode of the transistor 126, turns off the transistor 126. As a result, the voltage at the node 15 is about the logic high voltage, and the voltage at the node 12 is about the logic low voltage. With the logic low voltage at the node 12, the transistor 100 turns on to pull up the word line voltage to about the voltage of the first voltage supply.

The bypass path 140 enhances rising speed at the node 11 when the decoder signal goes low by strengthening driving current of the transistor 122 when the transistor 122 fights with the transistors 124, 126 to pull down the voltage at the node 12. FIG. 3 is a circuit diagram of the bypass path 140 and the negative pump 150 of FIG. 1 in accordance with various embodiments of the present disclosure. Transistors 141 and 142 of the bypass path 140 are interconnected to form an inverter-type circuit. In some embodiments, the transistor 141 is a PMOS transistor and the transistor 142 is an NMOS transistor. A gate electrode of the transistor 141 is electrically connected to the node 32 corresponding to the input terminal of the bypass path 140. A source electrode of the transistor 141 is electrically connected to a second voltage supply. A drain electrode of the transistor 141 is electrically connected to a node 31. In some embodiments, the node 31 is directly electrically connected to the node 16 corresponding to the source electrode of the transistor 122.

A gate electrode of the transistor 142 is electrically connected to the node 32. A drain electrode of the transistor 142 is electrically connected to the node 31. In some embodiments, a source electrode of the transistor 142 is electrically connected to an output terminal OUT of the negative pump 150. In some embodiments, the source electrode of the transistor 142 is electrically connected to the low voltage supply (e.g., ground).

Prior to the decoder signal transitioning to the logic low voltage (e.g., in standby), the node 32 of the bypass path 140 is at the logic low voltage. With the node 32 at the logic low voltage, the node 31 is at the logic high voltage, which biases the source electrode of the transistor 122 at about the logic high voltage (e.g., the logic high voltage minus a source-drain voltage $V_{SD}$ of the transistor 141). About the time the decoder 130 receives the address signal designating the word line driver 10, an input pulse is generated by a pulse generator 143 for input to the node 32. The pulse generator 143 is made of low $V_{TH}$ devices (e.g., core devices, low $V_{TH}$ transistors, or the like). An input terminal of the pulse generator 143 is electrically connected to the output terminal of the decoder 130 (node 13). An output terminal of the pulse generator 143 is electrically connected to the node 32. In some embodiments, the input pulse generated by the pulse generator 143 is a finite-duration pulse having the logic high voltage, and duration shorter than or equal to about one read period. The input pulse raises the voltage at the node 32. With the voltage at the node 32 at the logic high voltage, the transistor 141 is turned off, and the transistor 142 is turned on. When the transistor 142 is turned on, the voltage at the node 31 is pulled down.

When the voltage at the node 31 is pulled down, a coupling effect occurs at the nodes 16 and 12. Referring to FIG. 2, with the nodes 12 and 16 initially at the logic high voltage during standby, when the voltage at the node 16 drops, the coupling effect causes the voltage at the node 12 to be dropped rapidly, which improves rise time at the node 11.

In addition to the bypass path 140, the negative pump 150 further pulls down the voltage at the source electrode of the transistor 122. FIG. 4 is a circuit diagram of the negative pump 150 in accordance with various embodiments of the present disclosure. A logic gate 450, such as an inverter or a NAND gate (as shown in FIG. 4), receives the input pulse from the pulse generator 143. The input pulse is generated in response to, as a result of, or directly from the address signal activating the word line driver 10 for the read operation. In some embodiments, the logic gate 450 is a NAND gate, and the logic gate 450 outputs the logic low voltage (at node 42) when both input terminals of the logic gate 450 are biased at the logic high voltage. In some embodiments, the logic gate 450 is an inverter, and the logic gate 450 outputs the logic low voltage (at node 42) when the input terminal of the logic gate 450 is biased at the logic high voltage, and the logic high voltage when the input terminal is biased at the logic low voltage. When voltage bias at the input terminal labeled "RD" is the logic low voltage (corresponding to a non-read period), voltage at the node 42 is pulled high by the logic gate 450.

A capacitor 440 has a top plate electrically connected to the node 42, and a bottom plate electrically connected to a node 40 (e.g., the source electrode of the transistor 142, or the node 16) corresponding to an output of the negative pump 150. In some embodiments, the capacitor 440 is a MOS capacitor. In some embodiments, the capacitor 440 is a metal-oxide-metal (MOM) capacitor, a metal-insulator-metal (MIM) capacitor, another type of integrated capacitor, or the like.

A transistor 430 is electrically connected to the capacitor 440 and ground to pull down voltage at the node 40 to ground (or another low voltage level) during non-read periods. In some embodiments, the transistor 430 is an NMOS transistor. A gate electrode of the transistor 430 receives an inverted read signal RDB. When the inverted read signal RDB is logic level high (corresponding to a non-read period), the transistor 430 is turned on, and charge can flow from a drain electrode of the transistor 430 (node 40) to a source electrode of the transistor 430 (ground). In read periods, the transistor 430 is turned off by the inverted read signal RDB.

Transistors 400, 410, and 420 form a path for improving performance of the negative pump 150. The transistors 410 and 420 are NMOS transistors in some embodiments, and the transistor 400 is a PMOS transistor in some embodiments. In non-read periods, and prior to receiving the input pulse, the second input terminal of the logic gate 450 (labeled "IN") is at the logic low voltage. With the logic low voltage at a gate electrode of the transistor 400, and the second voltage V2 at a source electrode of the transistor 400, the transistor 400 is turned on, which introduces about the second voltage V2 (e.g., the second voltage V2 minus a source-drain voltage $V_{SD}$ of the transistor 400) at the node 41, which corresponds to a gate electrode of the transistor 420. As a result, the transistor 420 is turned on in the non-read periods and prior to receiving the input pulse (in read periods).

When the input pulse arrives during a read period (RD=High), the negative pump 150 pulls down voltage at the node 40 (e.g., the source electrode of the transistor 142). With the input terminal(s) of the logic gate 450 at the logic high voltage, the logic gate 450 pulls down the voltage at the node 42 to the logic low voltage. As a result, the node 40 is pulled down from the logic low voltage (e.g., 0 Volts) to a lower voltage due to capacitive coupling of the capacitor 440. The transistor 410 turns on due to the logic high voltage present at a gate electrode of the transistor 410, and the transistor 400 turns off due to the high voltage at the gate electrode of the transistor 400 ($V_{SG}$=0 Volts). The lower voltage is transmitted through the transistor 410 to the gate electrode of the transistor 420, so that the transistor 420 is turned off ($V_{GS}$<0 Volts). Performance of the negative pump 150 is improved by the transistors 400, 410, and 420, which prevent the lower voltage from being pulled up by ground through the transistor 420.

In some embodiments, the output terminal of the negative pump 150 is electrically connected to the source electrode of the transistor 122 through the transistor 142. In some embodiments, the output terminal of the negative pump 150 is directly electrically connected to the source electrode of the transistor 122. By pulling down the voltage at the source electrode of the transistor 122, the negative pump 150 improves current driving strength of the transistor 122 by increasing gate-source voltage $V_{GS}$ of the transistor 122. As a result, the transistor 122 is better able to pull down the voltage at the node 12, and the rising time for pulling up the word line voltage (at node 11) is decreased.

Figure 5:
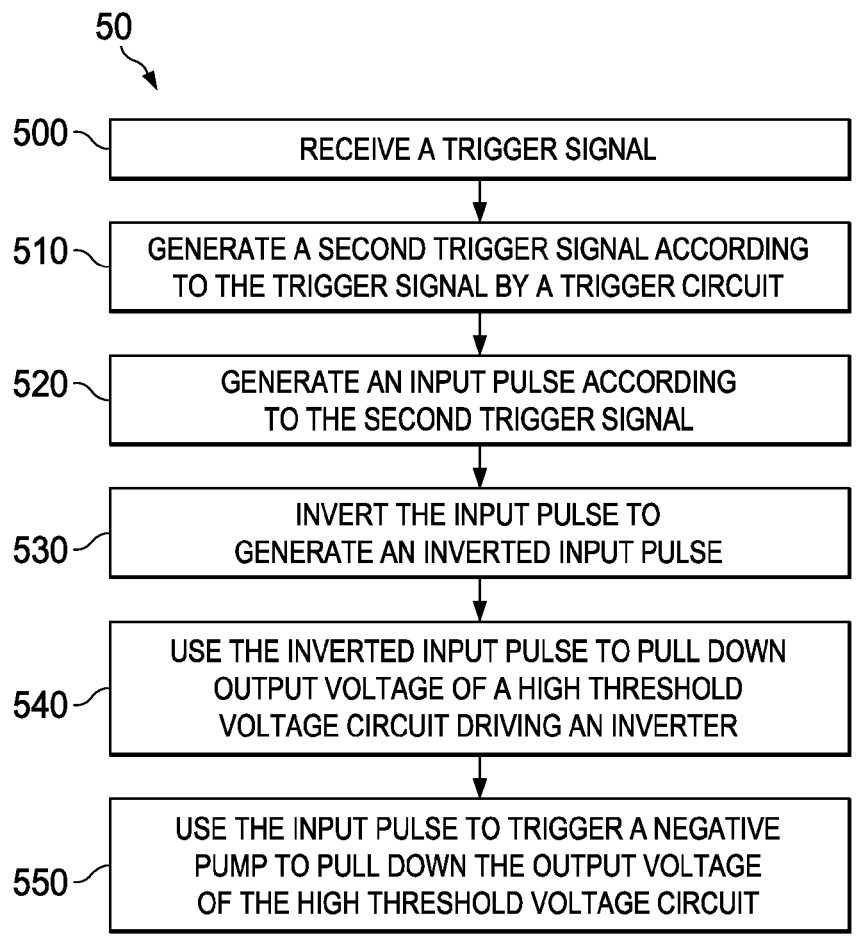
FIG. 5 is a flowchart of a method of driving a word line in accordance with various embodiments of the present disclosure.

FIG. 5 is a flowchart of a method 50 of driving a word line in accordance with various embodiments of the present disclosure. The method 50 may be performed using the word line driver 10 shown in FIGS. 1 to 4. In step 500, a trigger signal is received. In some embodiments, the trigger signal is the address signal is received by the decoder 130 corresponding to the word line WL.

A second trigger signal is generated according to the trigger signal by a trigger circuit in step 510. In some embodiments, step 510 corresponds to the decoder 130 generating the decoder signal (e.g., through the NAND logic operation) according to the address signal. The decoder signal may have logic low voltage when the address signal indicates the word line WL.

In step 520, an input pulse is generated according to the second trigger signal (e.g., the decoder signal). The input pulse may be generated by the pulse generator 143. In some embodiments, the pulse generator 143 generates a rising edge about the time the pulse generator 143 detects the falling edge of the decoder signal. In some embodiments, the pulse generator 143 generates a falling edge following the rising edge of the input pulse before the pulse generator 143 detects a subsequent rising edge of the decoder signal. In some embodiments, the pulse generator 143 includes an inverter, and the pulse generator 143 outputs the inverse of the decoder signal as the input pulse.

In step 530, the transistors 141, 142 of the bypass path 140 invert the input pulse to generate an inverted input pulse. The inverted input pulse is used to pull down the output voltage of a high threshold voltage circuit, such as the level shifter 120, in step 540. In some embodiments, the inverted input pulse causes coupling from the node 16 to the node 12 to pull down the output voltage. In addition to steps 530 and 540, step 550 includes using the input pulse to trigger the negative pump 150 to pull down the output voltage of the high threshold voltage circuit, such as the level shifter 120.

In some embodiments, step 510 is omitted. In some embodiments, step 550 is omitted. In some embodiments, steps 530 and 540 are omitted.

Figure 6:
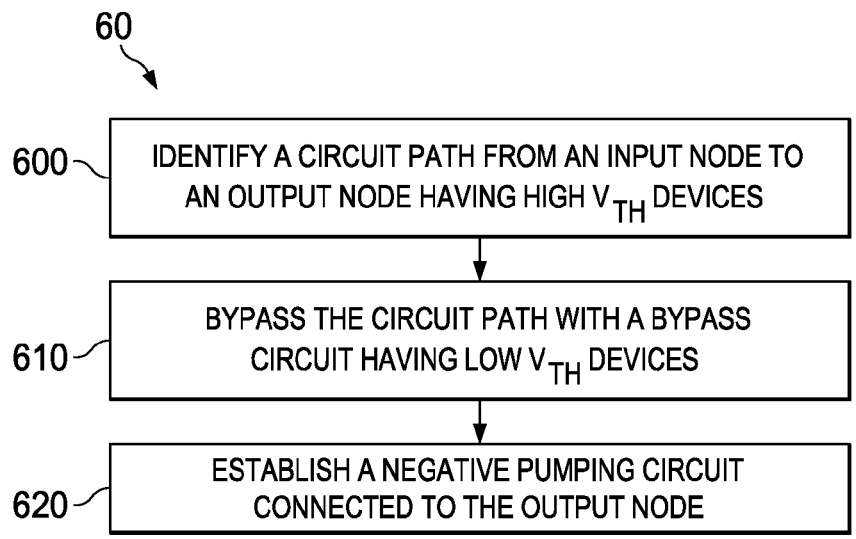
FIG. 6 is a flowchart of a method of designing a multiple power domain circuit in accordance with various embodiments of the present disclosure.

FIG. 6 is a flowchart of a method 60 of designing a multiple power domain circuit, such as the word line driver 10, in accordance with various embodiments of the present disclosure. The method 60 may be performed in an electronic design automation (EDA) software environment running on a computing device, such as a server or personal computer, having at least a processing unit and a memory unit.

In step 600, a circuit path is identified that runs from an input node to an output node. The circuit path has at least one high $V_{TH}$ device. In terms of the word line driver 10, in some embodiments, the circuit path includes the transistors 123, 125, and 126, the input node is the node 13, and the output node is the node 12.

In step 610, the circuit path is bypassed with a bypass circuit (e.g., the bypass path 140) having low $V_{TH}$ devices. In some embodiments, bypassing the circuit path includes establishing a circuit path in parallel with the circuit path. For example, the bypass path 140 is electrically connected from the node 13 to the node 12, and includes the pulse generator 143, the transistors 141, 142, and the transistor 122.

In step 620, a negative pumping circuit, such as the negative pump 150, is electrically connected to the output node (e.g., through the transistor 122).

In some embodiments, the method 60 does not include the step 610. In some embodiments, the method 60 does not include the step 620. By establishing the bypass circuit having the low $V_{TH}$ devices to bypass the circuit path having the high $V_{TH}$ devices, the method 60 improves performance (e.g., speed) of the multiple power domain circuit.

Figure 7:
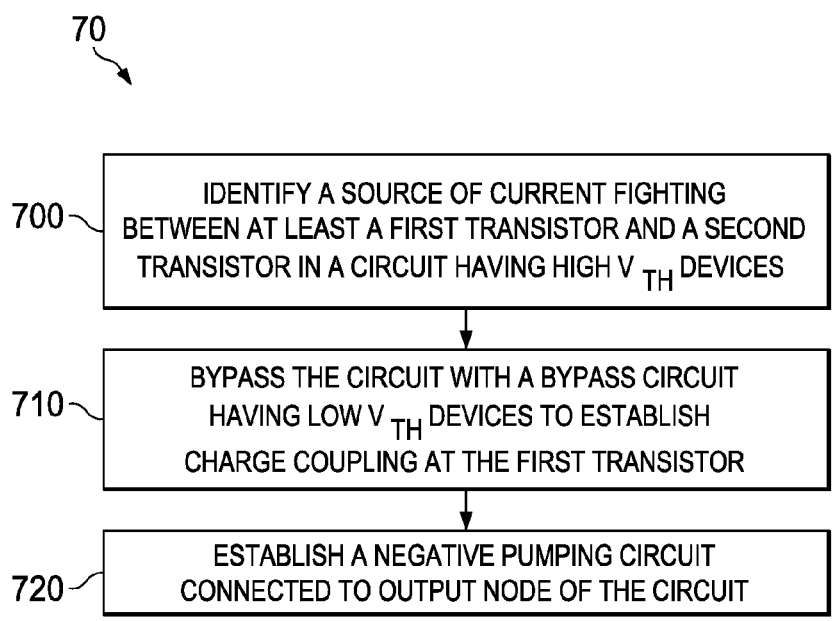
FIG. 7 is a flowchart of another method of designing a multiple power domain circuit in accordance with various embodiments of the present disclosure.

FIG. 7 is a flowchart of another method 70 of designing a multiple power domain circuit in accordance with various embodiments of the present disclosure. The method 70 may be performed in an electronic design automation (EDA) software environment running on a computing device, such as a server or personal computer, having at least a processing unit and a memory unit.

In step 700, a source of current fighting between at least a first transistor and a second transistor in a circuit having high $V_{TH}$ devices is identified. In terms of the word line driver 10, in some embodiments, the first transistor is the transistor 122, the second transistor is the transistor 126, and the circuit is the level shifter 120. In some embodiments, the first transistor and the second transistor have different type (e.g., N-type versus P-type, P-type versus N-type, or the like). In some embodiments, the current fighting is identified as occurring in a period at a beginning of a signal transition in which both the first transistor and the second transistor are turned on. In terms of the word line driver 10, the signal transition occurs at the beginning of a read period, when the decoder 130 outputs the logic low voltage in response to the address signal indicating selection of the word line driver 10.

In step 710, the circuit is bypassed with a bypass circuit having low $V_{TH}$ devices to establish charge coupling at the first transistor. By bypassing the level shifter 120 from the node 15 to the node 12, at the signal transition, the pulse generator 143 outputs the input pulse, which induces the charge coupling at the node 12 through the transistors 142 and 122.

In step 720, a negative pumping circuit (e.g., the negative pump 150) is electrically connected to the node 12 (output node of the level shifter 120). The negative pump 150 pulls down the voltage of the source electrode of the transistor 122, which improves current driving strength of the transistor 122 to mitigate the fighting between the transistor 122 and the transistor 126.

In some embodiments, the method 70 does not include the step 710. In some embodiments, the method 70 does not include the step 720. By establishing the bypass circuit having the low $V_{TH}$ devices to bypass the circuit path having the high $V_{TH}$ devices, the method 70 improves performance (e.g., speed) of the multiple power domain circuit.

Embodiments may achieve advantages over other multiple power domain circuits. The bypass path 140 induces charge coupling to pull down the voltage at the node 12 at the beginning of the read period. The negative pump 150 further pulls down the voltage at the source electrode of the transistor 122 to strengthen the driving current of the transistor 122, and mitigate the fighting between the transistor 122 and the transistor 126. These measures serve to speed up the rising time of the word line voltage at the beginning of the read period.

In accordance with various embodiments of the present disclosure, a multiple power domain circuit includes a decoder circuit. A high threshold voltage circuit is electrically connected to an output terminal of the decoder circuit. A low threshold voltage circuit is electrically connected to the output terminal of the decoder circuit and an output terminal of the high threshold voltage circuit. The low threshold voltage circuit comprises a pulse generator electrically connected to the output terminal of the decoder circuit. An inverter is electrically connected to an output terminal of the pulse generator, and the output terminal of the high threshold voltage circuit.

In accordance with various embodiments of the present disclosure, a method of operating a multiple power domain circuit includes receiving a trigger signal, generating an input pulse according to the trigger signal, inverting the input pulse to generate an inverted input pulse, and using the inverted input pulse to pull down output voltage of a high threshold voltage circuit driving an inverter.

In accordance with various embodiments of the present disclosure, a method of operating a word line driver circuit is provided. The word line driver circuit includes a level shifter. The level shifter includes high threshold voltage transistors. The method includes generating a decoder signal in response to an address signal corresponding to the word line driver circuit by a decoder; generating an input pulse at about an edge of the decoder signal by a pulse generator including first low threshold voltage transistors; receiving the input pulse by a negative pump including second low threshold voltage transistors; using the input pulse to generate a negative voltage drop at a source electrode of a pull-down transistor of the high threshold voltage transistors by the negative pump; and turning on the pull-down transistor while the negative voltage drop is generated to pull down output voltage of the level shifter.

Circuits are typically powered and/or biased by multiple voltages. The multiple voltages set up potential differences that allow electrical currents to flow throughout the circuit to perform various functions. Typically, electrical currents are defined as flowing from high voltage to low voltage. Voltage sources in circuits are also often defined in terms of a supply voltage and ground, with ground representing 0 Volts. Other definitions are sometimes given in terms of an upper supply voltage (VDD, VCC), and a lower supply voltage (VSS, VEE). Thus, a circuit that operates on a 1.8 Volt supply may be defined as having an upper bias of 0.9 Volts, and a lower bias of −0.9 Volts. In the following description, the term "ground" should be interpreted as including low supply voltage, such as the −0.9 Volts in the previous example, unless specifically referred to as "earth ground," or the like. Voltage levels, being relative, are not then intended so much to limit the scope of the disclosure, but more as a point of reference for convenient illustration.

Metal-oxide-semiconductor (MOS) transistors are typically described in terms of four transistor terminals: a gate, a source, a drain, and a bulk. It should be appreciated that most MOS transistors are symmetrical devices, such that the source and the drain thereof are interchangeable, and the terms "source" and "drain" often represent nomenclature for convenience of discussion. Terminals of MOS transistors may also be referred to as "electrodes," "ends," and the like, without any distinction intended through use of these different names. Biasing of such terminals is usually performed through direct or indirect contact between a direct current (DC) voltage source and the terminal being biased. The contact may be through metallization layers, contact vias, pads, bumps, and/or similar interconnect structures formed on and over device regions of the MOS transistors.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A multiple power domain circuit comprising:
   a trigger circuit;
   a high threshold voltage circuit electrically connected to an output terminal of the trigger circuit; and
   a low threshold voltage circuit electrically connected to the output terminal of the trigger circuit, the low threshold voltage circuit comprising:
   a pulse generator electrically connected to the output terminal of the trigger circuit; and
   an inverter electrically connected to an output terminal of the pulse generator, wherein an output of the inverter is directly coupled to a drain/source terminal of a transistor of the high threshold voltage circuit.

2. The multiple power domain circuit of claim 1, further comprising:
   a second inverter electrically connected to a word line and the output terminal of the high threshold voltage circuit.

3. The multiple power domain circuit of claim 2, wherein the high threshold voltage circuit is a level shifter comprising a pull-down transistor having a drain electrode electrically connected to the output terminal of the high threshold voltage circuit.

4. The multiple power domain circuit of claim 3, wherein the level shifter further comprises:
   a first transistor having:
     a gate electrode electrically connected to the output terminal of the trigger circuit; and
     a drain electrode electrically connected to a first internal node of the level shifter;
   a third inverter coupled to the gate electrode of the first transistor;
   a second transistor having:
     a gate electrode electrically connected to the output terminal of the trigger circuit;
     a source electrode electrically connected to a second internal node of the level shifter; and
     a drain electrode electrically connected to the first internal node of the level shifter;
   a third transistor having:
     a gate electrode electrically connected to the output terminal of the third inverter;
     a source electrode electrically connected to a third internal node of the level shifter; and
     a drain electrode electrically connected to the output terminal of the level shifter;
   a fourth transistor having:
     a gate electrode electrically connected to the output terminal of the level shifter; and
     a drain electrode electrically connected to the second internal node of the level shifter; and
   a fifth transistor having:
     a gate electrode electrically connected to the first internal node of the level shifter; and
     a drain electrode electrically connected to the third internal node of the level shifter.

5. The multiple power domain circuit of claim 4, wherein the low threshold voltage circuit is electrically connected to the output terminal of the high threshold voltage circuit through the pull-down transistor.

6. The multiple power domain circuit of claim 4, further comprising:
   a negative pump electrically connected to a source electrode of the pull-down transistor of the level shifter, the negative pump comprising:
   a logic gate electrically connected to the output terminal of the pulse generator;
   a capacitor having:
     a first terminal electrically connected to an output terminal of the logic gate; and
     a second terminal electrically connected to the source electrode of the pull-down transistor of the level shifter; and
   a sixth transistor having:
     a drain electrode electrically connected to the second terminal of the capacitor; and
     a source electrode electrically connected to a low voltage supply.

7. The multiple power domain circuit of claim 6, wherein the negative pump is directly electrically connected to a source electrode of a first inverter transistor of the inverter of the low threshold voltage circuit.

8. The multiple power domain circuit of claim 6, wherein the negative pump is directly electrically connected to the source electrode of the pull-down transistor of the level shifter.

9. The multiple power domain circuit of claim 6, wherein the negative pump further comprises:
   a seventh transistor electrically connected to the second terminal of the capacitor and the low voltage supply;
   an eighth transistor electrically connected to a high voltage supply and a gate electrode of the seventh transistor; and
   a ninth transistor electrically connected to the second terminal of the capacitor and the gate electrode of the seventh transistor.

10. A method of operating a multiple power domain circuit, the method comprising:
    receiving a trigger signal;
    generating an input pulse according to the trigger signal;
    inverting the input pulse to generate an inverted input pulse; and
    using the inverted input pulse to pull down an output voltage of a high threshold voltage circuit driving an inverter, wherein the inverted input pulse is directly applied to a drain/source terminal of a transistor of the high threshold voltage circuit.

11. The method of claim 10, wherein the step of generating the input pulse according to the trigger signal includes:
    generating a second trigger signal according to the trigger signal by a trigger circuit; and
    wherein the input pulse is generated according to the second trigger signal.

12. The method of claim 10, further comprising:
    using the input pulse to trigger a negative pump to pull down the output voltage of the high threshold voltage circuit.

13. The method of claim 12, wherein the step of using the input pulse to trigger the negative pump to pull down the output voltage of the high threshold voltage circuit includes:
using the negative pump to pull down voltage of a source electrode of a pull-down transistor of the high threshold voltage circuit.

14. The method of claim 10, wherein:
the step of receiving the trigger signal includes receiving an address signal by a decoder circuit; and
the step of generating the input pulse according to the trigger signal includes generating the input pulse by a low threshold voltage circuit in parallel with the high threshold voltage circuit.

15. The method of claim 14, wherein the step of inverting the input pulse includes inverting the input pulse by a second inverter of the low threshold voltage circuit.

16. The method of claim 10, wherein the step of using the inverted input pulse to pull down the output voltage of the high threshold voltage circuit includes pulling down the output voltage through a coupling effect caused by the inverted input pulse.

17. A method of operating a word line driver circuit comprising a level shifter, the level shifter comprising high threshold voltage transistors, the method comprising:
generating a decoder signal in response to an address signal corresponding to the word line driver circuit by a decoder;
generating an input pulse at about an edge of the decoder signal by a pulse generator comprising first low threshold voltage transistors;
receiving the input pulse by a negative pump comprising second low threshold voltage transistors;
using the input pulse to generate a negative voltage drop at a source electrode of a pull-down transistor of the high threshold voltage transistors by the negative pump; and
turning on the pull-down transistor while the negative voltage drop is generated to pull down an output voltage of the level shifter.

18. The method of claim 17, wherein the step of turning on the pull-down transistor while the negative voltage drop is generated to pull down the output voltage of the level shifter includes:
inverting the decoder signal by an inverter to generate an inverted decoder signal; and
receiving the inverted decoder signal at a gate electrode of the pull-down transistor.

19. The method of claim 17, wherein the step of using the input pulse to generate the negative voltage drop at the source electrode of the pull-down transistor of the high threshold voltage transistors by the negative pump includes:
generating the negative voltage drop by the negative pump directly electrically connected to the source electrode of the pull-down transistor.

20. The method of claim 17, wherein the step of using the input pulse to generate the negative voltage drop at the source electrode of the pull-down transistor of the high threshold voltage transistors by the negative pump includes:
generating the negative voltage drop by the negative pump directly electrically connected to an inverter of a bypass path directly electrically connected to the source electrode of the pull-down transistor.

* * * * *